(12) United States Patent
Leppänen et al.

(10) Patent No.: US 8,502,524 B2
(45) Date of Patent: Aug. 6, 2013

(54) CURRENT MEASUREMENT IN AN INVERTER UNIT AND A FREQUENCY CONVERTER

(75) Inventors: Ora Veli-Matti Leppänen, Helsinki (FI); Matti Laitinen, Kirkkonummi (FI); Jussi Suortti, Helsinki (FI)

(73) Assignee: ABB Oy, Helsinki (FI)

( * ) Notice: Subject to any disclaimer, the term of this patent is extended or adjusted under 35 U.S.C. 154(b) by 771 days.

(21) Appl. No.: 12/547,353

(22) Filed: Aug. 25, 2009

(65) Prior Publication Data

US 2010/0128505 A1 May 27, 2010

(30) Foreign Application Priority Data

Sep. 23, 2008 (EP) .................................. 08164883

(51) Int. Cl.
*G01R 19/18* (2006.01)
(52) U.S. Cl.
USPC ........... 324/120; 324/522; 324/548; 324/679; 324/76.11; 363/37; 363/41; 363/98; 363/131
(58) Field of Classification Search
USPC ............ 324/120, 500, 522, 548, 679; 363/98, 363/37, 41, 131
See application file for complete search history.

(56) References Cited

U.S. PATENT DOCUMENTS

| | | | | |
|---|---|---|---|---|
| 4,425,541 A | * | 1/1984 | Burkum et al. | ............... 324/548 |
| 5,163,172 A | * | 11/1992 | Hakala | ........................... 324/111 |
| 5,235,503 A | * | 8/1993 | Stemmler et al. | ............... 363/37 |
| 5,381,328 A | | 1/1995 | Umezawa et al. | |
| 5,859,772 A | | 1/1999 | Hilpert | |
| 5,969,958 A | * | 10/1999 | Nielsen et al. | ................... 363/41 |
| 6,611,441 B2 | * | 8/2003 | Kurokami et al. | ......... 363/56.02 |
| 6,940,735 B2 | * | 9/2005 | Deng et al. | ....................... 363/37 |
| 7,042,191 B2 | * | 5/2006 | Hirono | .......................... 318/801 |
| 7,508,688 B2 | * | 3/2009 | Virolainen | ...................... 363/95 |
| 7,804,288 B2 | * | 9/2010 | Ollila et al. | ................ 324/76.11 |
| 2005/0105306 A1 | | 5/2005 | Deng et al. | |
| 2007/0279947 A1 | * | 12/2007 | Brandt et al. | ................... 363/35 |

FOREIGN PATENT DOCUMENTS

| | | |
|---|---|---|
| CN | 1063596 C | 3/2001 |
| EP | 0 595 319 | 5/1994 |
| EP | 1 385 360 A1 | 1/2004 |
| GB | 1151457 | 5/1969 |
| JP | 07-322638 | 12/1995 |

OTHER PUBLICATIONS

Office Action dated Dec. 21, 2010, issued in the corresponding European Patent Application No. 08 164 883.4-2216.
European Search Report of Application No. 08164883.4dated Mar. 27, 2009.
English Translation of Office Action for Chinese Application No. 200910171360.07 filed Aug. 27, 2009, dated Dec. 4, 2012 with Search Report.

* cited by examiner

*Primary Examiner* — Arleen M Vazquez
(74) *Attorney, Agent, or Firm* — Buchanan Ingersoll & Rooney PC

(57) ABSTRACT

A method and an arrangement of measuring inverter current, where the inverter is connected to and supplied by a DC intermediate circuit having two or more parallel capacitor branches connected between the positive and negative rail of the DC intermediate circuit, and the capacitance of the capacitor branches being known. The method comprises the steps of measuring the current of one of the parallel capacitor branches, and determining from the measured current the magnitude of the inverter current.

18 Claims, 3 Drawing Sheets

CURRENT MEASUREMENT IN AN INVERTER UNIT AND A FREQUENCY CONVERTER

FIELD OF THE INVENTION

The present invention relates to a method of measuring the current of an inverter unit, and particularly to current measurement carried out in an inverter connected to a supplying DC voltage circuit.

BACKGROUND OF THE INVENTION

Inverters or inverter units are devices used for producing variable frequency voltage from a direct voltage source. A typical application of an inverter is in a frequency converter, in which a rectifier unit rectifies AC voltage from a supplying network to a DC voltage to an intermediate voltage circuit. The intermediate voltage circuit or a DC bus consists of positive and negative terminals or rails and a capacitor bank connected between the terminals. The DC bus is further connected to the inverter unit for inverting the DC voltage of the DC bus to alternating output voltage. The alternating output voltage of the inverter is used typically for driving a load such as an electrical motor.

The main circuit of an inverter consists of series connected semi-conductor switches connected between the positive and negative intermediate voltages, and the point between the switches defines a phase output. By employing three of these series connections of switches in parallel, a three phase output is formed. Each output phase voltage can be selected to be either the voltage of the positive rail or the negative rail of the intermediate circuit.

There are many differing schemes for controlling the output switches for controlling the load in a desired manner. These control schemes or methods are typically based on feedback from some measured quantity, such as inverter current. The measurements of current are also used for purposes of protection, such as for overcurrent or short circuit protection.

The inverter currents are usually measured directly from the phase outputs for control purposes. This, however, requires at least two measurements in a three-phase system. The overcurrent protection can be carried out by measuring voltages of the output phases with respect to the negative rail of the intermediate circuit. If the voltage of a semiconductor switch, such as an IGBT, which is controlled conductive, is not small enough, it is assumed that the current of that IGBT is so high that the component does not stay in saturation. For this to occur, the current of the IGBT has to be much greater than twice the rated current. It is thus assumed that the output of the inverter is in short-circuit. The voltage measurement gives the voltages over the lower switches, i.e. switches connected to the negative rail. The voltages over the upper switches are obtained by subtracting the measurement results from the DC-link voltage.

Inverter currents can also be determined by measuring DC-current flowing in the intermediate circuit either in the positive or negative rail. Only one measurement is required. A problem relating to DC current measurement is that the current to be measured can be very high. Measurement is typically carried out by using a shunt resistor and by measuring the voltage drop in the resistor due to the current. Further, in high powers the intermediate circuit is designed to have low impedance. When a shunt resistor is added to the intermediate circuit rail, the rail has to be made from two pieces connected with the shunt resistor. The addition of the resistor increases the amount of impedance in an undesirable manner.

BRIEF DESCRIPTION OF THE INVENTION

An object of the present invention is to provide a method and an arrangement for implementing the method so as to solve the above problems. The objects of the invention are achieved by a method and an arrangement which are characterized by what is stated in the independent claims. The preferred embodiments of the invention are disclosed in the dependent claims.

The invention is based on the idea of using at least two parallel capacitors in the intermediate voltage source and measuring the current in one of the capacitor branches. Since the capacitances of the capacitors are known, this measured current can be directly used for indicating an overcurrent situation or the actual value of the output phase current can be calculated from the measured value.

With the method and arrangement of the invention, the phase currents can be measured and an overcurrent situation can be detected using simple and small sized components. Further, the rails of the intermediate voltage circuit do not need any modifications enabling a low-inductance design to be maintained.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
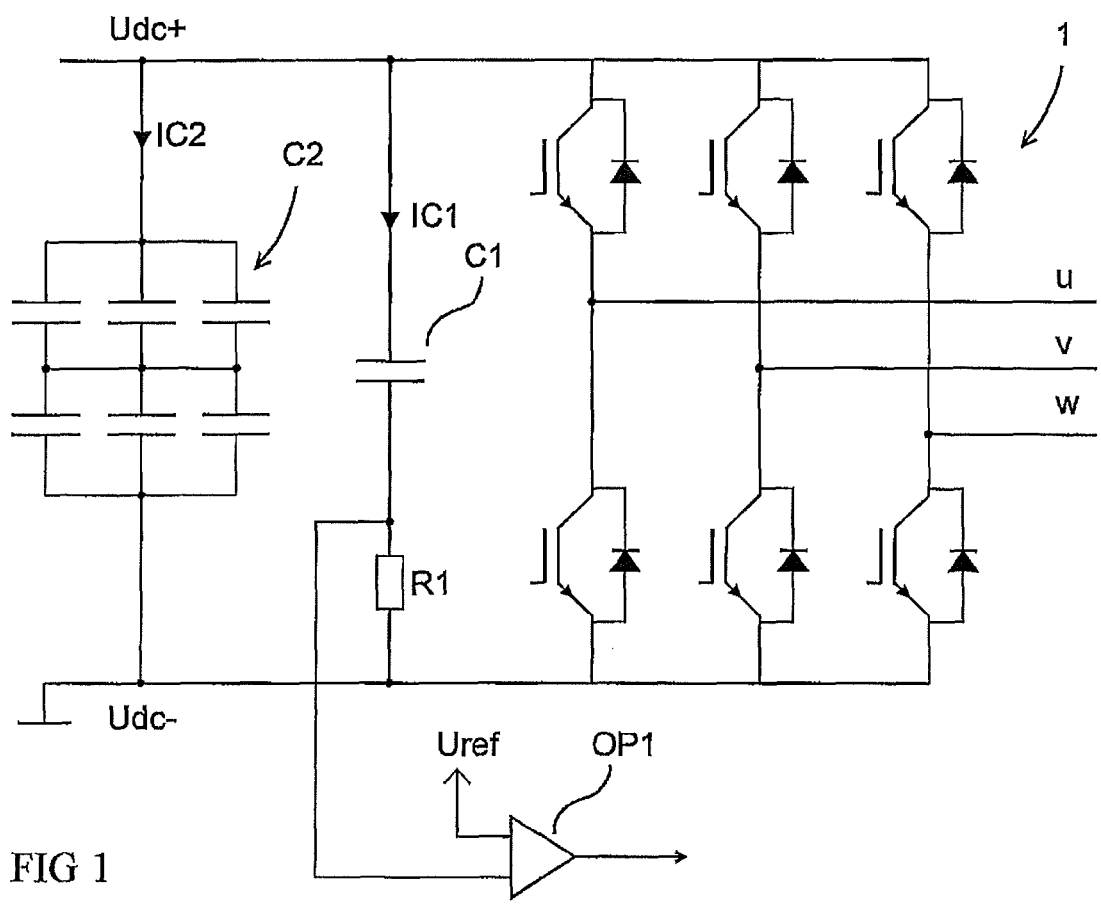
FIGS. 1, 2 and 3 illustrate embodiments of the invention in connection with short-circuit protection.

FIG. 1 illustrates an inverter connected to a DC circuit equipped with the arrangement of the invention. In FIG. 1, a capacitor bank C2 comprising six capacitors is connected between the positive rail Udc+ and negative rail Udc− of the intermediate voltage circuit. Further, three parallel connections of series connected IGBT switches form the actual inverter circuit 1. IGBT switches are used in the inverter to form output voltages U, V, W in a known manner.

FIG. 1 shows further a separate capacitor C1 connected in parallel with the capacitor bank C2. This parallel branch includes also a shunt resistor R1 in series with the capacitor C1. When a current flows to or from the capacitors of the intermediate circuit, the current is divided such that the ratio between the current of capacitor bank C2 (IC2) and capacitor C1 (IC1) is the same as the ratio between their capacitances, i.e. $\frac{IC2}{IC1} = \frac{C2}{C1}$.

Thus, the current to or from the capacitor bank of the intermediate voltage circuit can be determined when the current of capacitor C1 is measured.

The source of short-circuit current is the capacitor bank of the intermediate source. The capacitance of the capacitor bank is quite high in high power inverters and if a short-circuit appears, the capacitance discharges quickly providing a high short-circuit current. Due to capacitive current sharing the capacitors are discharged as indicated above and by measuring a current of a smaller capacitance the total current of the capacitor bank can be determined. If a separate capacitor is arranged for current measurement as indicated in FIG. 1, the capacitance of this capacitor should be selected to be substantially smaller than the capacitance of the capacitor bank. With this selection, the current measurement is easier to accomplish and cheaper measurement devices can be used.

In FIG. 1 a shunt resistor R1 and an operational amplifier OP1 are used for current measurement of one branch of capacitors. Current running through the resistor R1 causes a voltage drop in the resistor. The size of the voltage drop is determined with the operational amplifier by leading the voltage of the resistor to one input of the operational amplifier. The other input of the operational amplifier is the reference voltage Uref, which is referenced to the negative rail of the intermediate voltage circuit Udc−. When the voltage drop in the resistor R1 exceeds the reference voltage Ured, the current in the capacitors of the intermediate voltage source exceeds a set limit. This limit is chosen to represent overcurrent. Thus, the resistance R1 and the reference voltage Uref are designed such that when the current of the inverter rises and an overcurrent situation appears, the operational amplifier changes its state to indicate the overcurrent. The overcurrent information is obtained fast without need for any voltage measurements or synchronizations to the output switches. The information is further fed to control circuitry for driving the inverter down.

In FIG. 1, the control of the inverter is situated in the potential of the negative rail of the intermediate voltage circuit, and thus the reference voltage Uref for the comparator OP1 is referenced against the negative rail.

Figure 2:
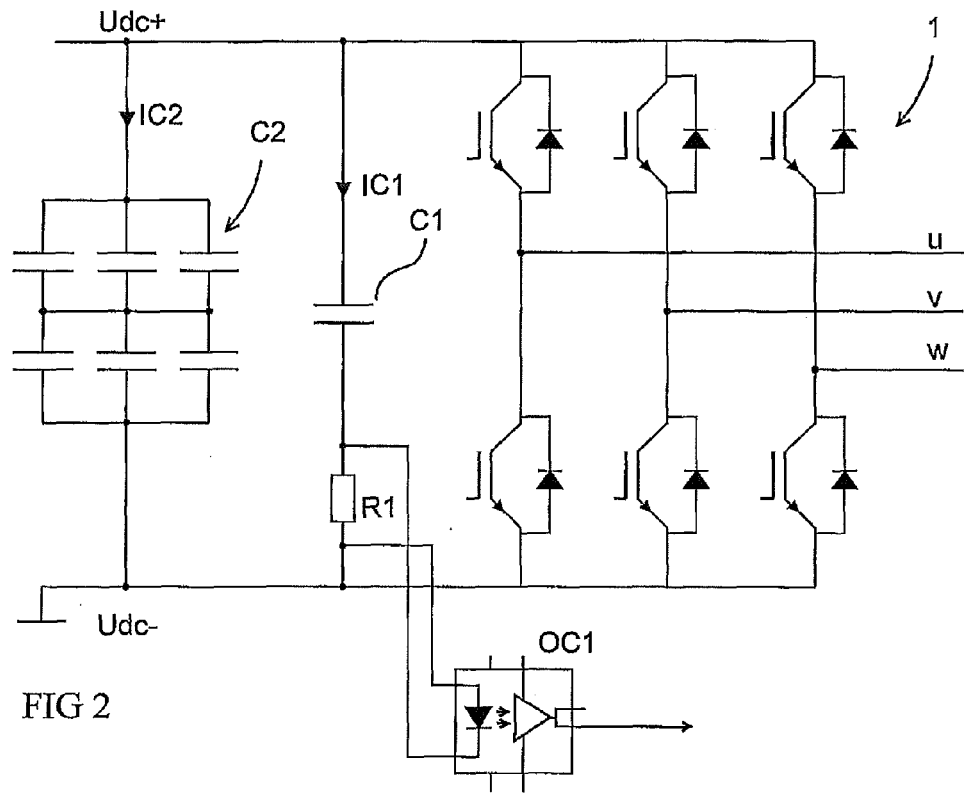

In case the control of the inverter is in the potential of ground, the voltage drop in the measurement resistor R1 can be measured differentially as indicated by FIG. 2. In FIG. 2 an optocoupler OC1 is connected across the resistor R1, and the output of the optocoupler changes its state if the voltage drop in the resistor R1 is higher than a predefined limit. Thus, the resistor R1 is dimensioned as in example of FIG. 1. The circuit of FIG. 2 may also be better in the sense of disturbances than the circuit of FIG. 1, and it is thus usable even if the overcurrent signal need not be taken to another potential.

In the circuit of FIG. 2, the measurement resistor R1 should be dimensioned such that when operation is in the maximal allowable current range, the current of the led of the optocoupler should give Zero to the output of the optocoupler. When a short-circuit appears, the current of the led must in turn be high enough to give a clear indication in the output that the overcurrent value has been exceeded.

Figure 3:
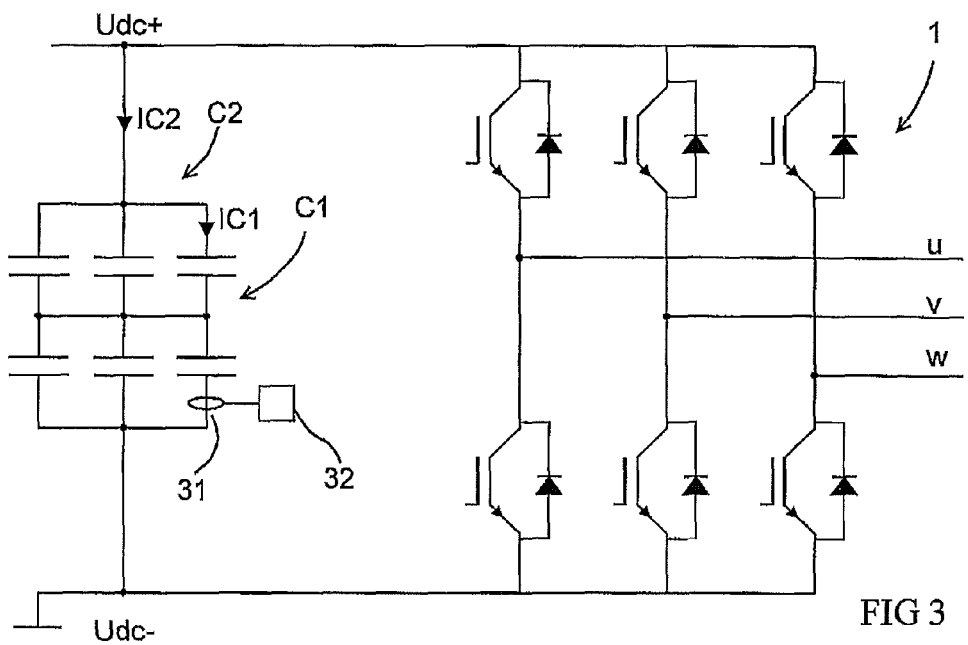

FIG. 3 shows another embodiment for measurement of current of one parallel branch of the intermediate circuit capacitors. In this embodiment of the invention, no additional measurement capacitors or resistors are arranged in the intermediate circuit. In this embodiment, the current is measured in one of the branch C1 of the capacitor bank C2. In the example of FIG. 3, the number of parallel branches is three and when the capacitances of the parallel branches are similar, the current of one branch is one third of the total capacitor bank current. In the example of FIG. 3, the branch in which the current is measured consists of two series connected capacitors. Although there are no additional substantially smaller capacitors connected to the intermediate circuit, the current is one third of the total current and thus easier to measure. In this case, the measurement is preferably carried out by a galvanically separating current transformer 31, which is further connected to a circuit 32 which determines if the current exceeds the maximum allowable limit and further produces a signal to a control system.

The current transformer 31 is, for example, a Rogowski coil, which can be mounted in a tight place in a capacitor bank and which is fast in operation. As with the other measurement variants, also the current transformer and its circuitry have to be dimensioned to generate an overcurrent signal only when the current exceeds the set limit. The circuit 32 includes, for example, a resistance coupled to the secondary of the transformer, and means for comparing voltage drop in the resistor with a set limit value. The circuit 32 also outputs overcurrent information to the control circuitry similarly as in the FIGS. 1 and 2. A transformer is suitable for measuring the current of a capacitor bank since the capacitor current does not have a DC component that could saturate the transformer.

The following is an example of dimensioning the series connection of the capacitor C1 and the shunt resistor R1 of FIGS. 1 and 2. Assuming the inverter is a 110 kW inverter with 400 Volts voltage rating. The nominal current of the inverter is approximately 200 A and the overcurrent limit is approximately 700 Amps. This means that 400 Amps IGBT switches are required. The short-circuit current limit is selected as 4*400 A=1600 Amps. The capacitance of the capacitor bank C2 is selected to be 5700 µF.

By choosing the capacitance of the measurement capacitor C1 to be 100 nF, the peak value of the short-circuit current flowing through it is 100 nF/5700 µF*1600 A=28 mA. Let's further choose the comparing voltage of the comparator to be −1V. Then the resistance required for the shunt resistor R1 is thus 1V/28 mA=36 Ohms.

The current of the capacitor bank in the inverter with the nominal power is approximately 0,7*200 A=140 Amps. The current of the measurement capacitor C1 is approximately 100 nF/5700 µF*140 A=2,5 mA and the power loss in the shunt resistor is $(2,5 \text{ mA})^2 * 36\Omega = 0,23$ mW.

As seen from the example, the current of the measurement branch is minimal when compared with that of the capacitors in parallel with the measurement capacitor. Also, the power loss in the resistor is minimal and the resistor can be selected to be small in physical size. Thus, the actual current provided with the measurement capacitor does not have to be taken into account in the overcurrent protection or the capacitance of the measurement capacitor does not need to be taken into account in the total capacitance of the intermediate circuit.

Figure 4:
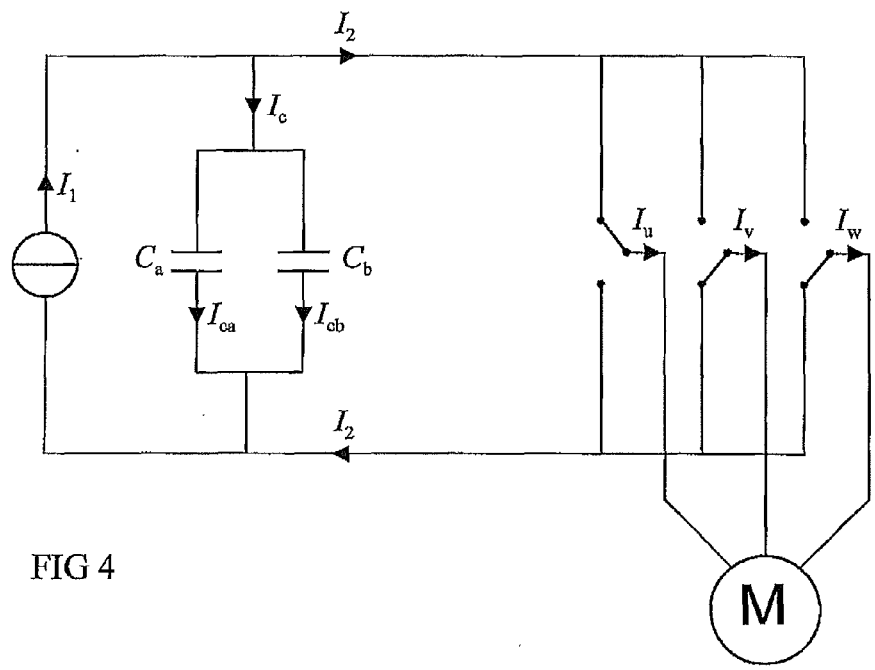
FIGS. 4 and 5 illustrate the present invention in connection with measurement of phase currents.
Figure 5:
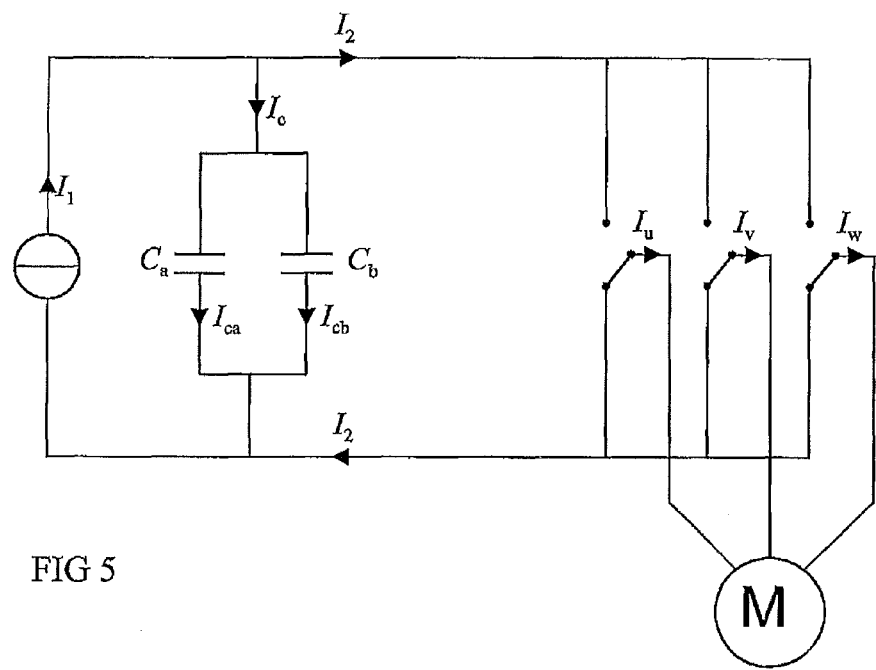

The present invention can also be used in measuring phase currents of the inverter. This is explained with reference to FIGS. 4 and 5, which show a schematic representation of a three-phase inverter with a capacitor bank in the voltage intermediate circuit. FIGS. 4 and 5 show the output switches in a schematic manner as turn-over switches which connect either the positive or negative auxiliary voltage to a load (M).

In FIG. 4, a three-phase inverter with a capacitor bank (Ca, Cb) in the intermediate dc-link is schematically shown. The figure represents an instant, where one of the inverter output phases (phase u) is connected to the positive dc bus, and the other two output phases are connected to the negative dc bus. The currents in the various branches of the circuit are shown in FIG. 4. $I_1$ is the input side current, which can be considered to be constant (due to input side inductance, not shown in the figures). Let us assume that the current $I_{cb}$ is measured, for example by manners described in connection with FIG. 1, 2 or 3. The capacitive current sharing between the branches ensures that the measured current is only a portion of the total capacitor bank current $I_c$. From FIG. 4 it can be seen that the capacitor bank total current $I_c$ can be written as $$I_c = I_1 - I_2 \tag{1}$$

and the current of the capacitor $C_b$ as $$I_{cb} = I_c C_b / (C_a + C_b) \tag{2}$$

Since $I_2=I_u$ we obtain $$I_{cb}=(I_1-I_u)C_b/(C_a+C_b) \quad (3)$$

Now, let us assume that phase u is switched to the negative dc bus. The resulting situation is depicted in FIG. 5. Since $I_2=I_u=0$, the above equation (3) can be rewritten as $$I_{cb}=I_1C_b/(C_a+C_b) \quad (4)$$

Taking the difference of capacitor $C_b$ current $I_{cb}$ measured just prior to switching (equation 3) and that measured just after the switching (equation 4), we obtain $$\Delta I_{cb}=-I_u C_b/(C_a+C_b) \quad (5)$$

Hence, in this example, the output current in phase u, at the switching instant can be determined as $$I_u=-\Delta I_{cb}(C_a+C_b)/C_b \quad (6)$$

It is easy to see that no matter which of the eight possible states of the three inverter switches was in use prior to turning any one of the switches to another position, the change in the capacitor bank current is equal to the actual value of the output phase current in the switching phase. Thus by determining the change of the capacitor bank current, the phase current can be determined. By measuring the current in one of the parallel branches in the capacitor bank, the total current can be calculated once the capacitance values are known.

The actual current measurement can be implemented by several means as described above. One particularly suitable means is the use of a current transformer, since the capacitor current does not contain a dc-component. It should be noted, that due to the capacitive current sharing, the current $I_{cb}$ represents only a fraction of the actual output current. Hence, the measurement device does not need to be dimensioned for the full current.

An additional benefit comes from the fact that all three output phase currents are measured using the same circuitry; any offset or gain error in the measurement affects equally all the measurements, especially the offset can be compensated for altogether, and the measurement gain error does not cause asymmetry in the actual phase currents, which would be the case if separate output current measurement devices were used.

The measured phase currents can be used in a normal manner, for example, for purposes of control. The current of one capacitor branch is measured or sampled at instants between each inverter output switch state changes. Thus, a current sample is taken every time the output switches change their state. The state change can be communicated to the sampling circuitry from a circuit controlling the switching. It is enough to sample the current once between the switching instants and to use the sampled values twice, i.e. as the new value from which a previous value is subtracted and, after that, as an older value, which is subtracted from a newer value.

FIGS. 1, 2 and 3 show some possibilities for measuring the capacitor current and circuitry for comparing the measured current for purposes of overcurrent protection. It is clear that the obtained voltage values used for comparing can also be used for calculation of output currents. In a known manner, a voltage drop in a resistor caused by a current is directly proportional to the current. The measured voltages are fed to a microprocessor or similar means that can perform simple calculation operations. The voltage values are converted to current values when the ohmic value of the measurement resistor is known. The obtained current value is stored in a register and a calculation according to equation (6) is carried out for obtaining the phase current value. The calculated phase current value can easily be assigned to a correct output phase since the switch that changed its state is known in the control system.

It is clear that the principle outlined here can be adapted also to other switching topologies than just the three-phase inverter.

In the above, the invention is described in connection with short-circuit or overcurrent protection and in connection with output phase current measurement. In the embodiments relating to short-circuit protection the actual value of the current is not calculated. The magnitude of the current can, however, be calculated as in connection with the phase currents. Since the purpose is protection, the operation should be as fast as possible, and the calculation of current magnitude is omitted.

The inverter described above may be a stand-alone inverter connectable to a DC-source or it may be comprised by a frequency converter.

It will be obvious to a person skilled in the art that the inventive concept can be implemented in various ways. The invention and its embodiments are not limited to the examples described above but may vary within the scope of the claims.

The invention claimed is:

1. A method of measuring inverter current, where the inverter is connected to and supplied by a DC intermediate circuit having two or more parallel capacitor branches connected between the positive and negative rail of the DC intermediate circuit, and the capacitance of the capacitor branches being known, the method comprising:
   measuring current of one of the parallel capacitor branches; and
   determining from the measured current a magnitude of the inverter current,
   wherein measuring the current of one of the parallel capacitor branches includes:
   measuring current of one of the parallel branches before and after a switching instant of the inverter output switches to obtain first and second current values, and
   wherein determining the magnitude of the inverter current comprises:
   calculating a change in the measured current by subtracting the second current value from the first current value; and
   calculating an output phase current from known capacitance values and from the change in the measured current.

2. A method according to claim 1, wherein the determining step comprises:
   comparing the measured current with a set current limit; and
   determining on the basis of the comparison when an overcurrent situation has occurred in an inverter output.

3. A method according to claim 2, wherein the current is measured as a resistive voltage drop and comparison is carried out by comparing the voltage drop with a set voltage limit.

4. A method according to claim 2 wherein the capacitor branch in which the current is measured has a smaller capacitance than a capacitance of another branch.

5. A method according to claim 1, comprising:
   determining an output phase of the phase current, the output phase being one that changed state.

6. A method according to claim 1 wherein current is sampled between each switching instant continuously and each sample is used for obtaining two consecutive phase current values.

7. An arrangement for measuring inverter current of an inverter, where the inverter is connected to and supplied by a DC intermediate circuit having two or more parallel capacitor branches connected between a positive and negative rail of the DC intermediate circuit, and wherein a capacitance of the capacitor branches is known, the arrangement comprising:

means for measuring current of one of the parallel capacitor branches; and means for determining from the measured current a magnitude of an inverter current, wherein the means for measuring the current is configured to measure the current of one of the parallel branches before and after a switching instant of the inverter output switches to obtain first and second current values, and wherein the means for determining the magnitude of the inverter current is configured to calculate a change in the measured current by subtracting the second current value from the first current value and to calculate an output phase current from the known capacitance values and the change in the measured current.

8. An arrangement as claimed in claim 7, wherein the means for measuring the current includes:

comparing means for comparing the measured current with a set current limit for obtaining overcurrent information.

9. An arrangement according to claim 8, wherein the means for measuring the current includes:

a resistive element arranged in series with the capacitor and a value of the current is measured as a resistive voltage drop and the comparing means is configured for comparing the resistive voltage drop with a set voltage value.

10. An arrangement according to claim 8, wherein the means for measuring the current includes:

a current transformer and a value of current is measured as a resistive voltage drop in a secondary of the transformer, and the comparing means are configured for comparing the voltage drop in the resistive element with a set voltage value.

11. An arrangement according to claim 10 wherein a capacitor branch in which the current is measured has a smaller capacitance than a capacitance of another branch.

12. An arrangement according to claim 8 wherein a capacitor branch in which the current is measured has a smaller capacitance than a capacitance of another branch.

13. An arrangement according to claim 7, wherein the means for determining the inverter current are configured to determine the output phase of the phase current, the output phase being a phase that changed state.

14. An arrangement according to claim 13 wherein current is sampled between each switching instant continuously and each sample is used for obtaining two consecutive phase current values.

15. An arrangement according to claim 7 wherein current is sampled between each switching instant continuously and each sample is used for obtaining two consecutive phase current values.

16. An arrangement according to claim 7, wherein the means for measuring the current includes:

a resistive element arranged in series with a capacitor and current is measured as a resistive voltage drop; and comparing means to compare the resistive voltage drop with a set voltage value.

17. An arrangement according to claim 7, wherein the means for measuring the current includes:

a current transformer and current is measured as a resistive voltage drop in a secondary of the transformer.

18. An arrangement according to claim 7, in combination with a frequency converter.

* * * * *